(12) United States Patent
Lu et al.

(10) Patent No.: US 10,276,756 B2
(45) Date of Patent: Apr. 30, 2019

(54) LED DISPLAY PANEL

(71) Applicant: Shenzhen China Star Optoelectronics Technology Co., Ltd., Shenzhen, Guangdong (CN)

(72) Inventors: Po-Yen Lu, Guangdong (CN); Yuan-Chun Wu, Guangdong (CN); Wei Yuan, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/541,368

(22) PCT Filed: May 27, 2017

(86) PCT No.: PCT/CN2017/086301
§ 371 (c)(1),
(2) Date: Jul. 1, 2017

(87) PCT Pub. No.: WO2018/196090
PCT Pub. Date: Nov. 1, 2018

(65) Prior Publication Data
US 2018/0315900 A1    Nov. 1, 2018

(30) Foreign Application Priority Data
Apr. 28, 2017   (CN) .......................... 2017 1 0295385

(51) Int. Cl.
*H01L 33/50*     (2010.01)
*H01L 25/16*     (2006.01)
(Continued)

(52) U.S. Cl.
CPC ........ *H01L 33/504* (2013.01); *H01L 25/0753* (2013.01); *H01L 25/167* (2013.01);
(Continued)

(58) Field of Classification Search
CPC ..................................................... H01L 33/504
(Continued)

(56) References Cited

U.S. PATENT DOCUMENTS 9,846,270 B2 * 12/2017 Tang .................... G02B 6/0026
9,887,248 B2 *  2/2018 Jun ....................... H01L 51/502
(Continued)

FOREIGN PATENT DOCUMENTS

| CN | 106356386 A | 1/2017 |
|---|---|---|
| CN | 205910483 U | 1/2017 |
| CN | 206022367 U | 3/2017 |

OTHER PUBLICATIONS

U.S. Appl. No. 13/920,925, filed Dec. 18, 2014, Andreas Bibl et al.

*Primary Examiner* — Calvin Lee
(74) *Attorney, Agent, or Firm* — Andrew C. Cheng

(57) ABSTRACT

The present disclosure discloses an LED display panel including at least a thin film transistor array layer, a quantum dot light emitting layer, and an LED array layer arranged between the thin film transistor array layer and the quantum dot light emitting layer, when the LED array layer emits excitation light, the excited quantum dot emits light to emit at least two colors of light. The present disclosure can reduce the production cost and greatly improve the production yield, and can effectively reduce the energy consumption of the display panel and improve the service life.

18 Claims, 2 Drawing Sheets

(51) Int. Cl.
*H01L 29/66* (2006.01)
*H01L 31/0352* (2006.01)
*H01L 31/055* (2014.01)
*H01L 25/075* (2006.01)
*H01L 29/20* (2006.01)

(52) U.S. Cl.
CPC .................. *H01L 29/66977* (2013.01); *H01L 31/035218* (2013.01); *H01L 31/055* (2013.01); *H01L 33/502* (2013.01); *H01L 2933/0041* (2013.01)

(58) Field of Classification Search
USPC .................................. 438/31, 35; 257/89, 98
See application file for complete search history.

(56) References Cited

U.S. PATENT DOCUMENTS

| | | | |
|---|---|---|---|
| 2016/0111405 A1 | 4/2016 | Bibl et al. | |
| 2016/0204317 A1* | 7/2016 | Li | F21V 13/14 |
| | | | 362/293 |
| 2017/0018231 A1* | 1/2017 | Liu | G09G 3/3688 |
| 2017/0059129 A1* | 3/2017 | Li | G02F 1/1336 |
| 2017/0168217 A1* | 6/2017 | Li | G02B 6/0026 |

* cited by examiner

LED DISPLAY PANEL

FIELD OF THE DISCLOSURE

The present disclosure relates to a display technology field, and more particularly to a LED display panel.

BACKGROUND OF THE DISCLOSURE

Micro-LED (micro light Emitting Diode) technology refers to a chip in the integration of high-density small size LED array, as the LED display, and each pixel unit can be addressed, a separate drive light, that can be seen as a small version of outdoor LED display. When the LED pixel distance from the millimeter to the micron level, compared to the existing micro-display technology DLP, LCoS, MEMS Scanning, as the micro-LED has a self-luminous characteristic, no external light source, the optical system can be simple to reduce the overall system size, weight, cost, while taking into account low power consumption, rapid response and other characteristics. Relative to the LCD & AMOLED display screen high power characteristics, micro-LED as the next generation of consumer-level LED display technology, can make the screen while maintaining high brightness, but also to ensure low energy consumption of the device. This is very demanding on the volume of wearable equipment, while ensuring the battery capacity of the device at the same time, you can effectively reduce the most important screen energy consumption, improve battery life to solve the dilemma of the "one day a charge" of the current mobile and wearable equipment.

At present, micro-LED monochrome blue light display brightness and life performance advantage is obvious, but the full color, yield, luminous wavelength consistency is micro-LED current main problem. Monochrome micro-LED array can be flip through the structure of the package and driver IC can be achieved, and RGB array needs to be redistributed red, green and blue ternary grain, need to embed hundreds of thousands of grain, for the LED grain luminous efficiency, the luminous wavelength of the consistency, higher yield requirements, the corresponding cost of higher costs.

SUMMARY OF THE DISCLOSURE

The technical problem that the present disclosure mainly solves is to provide an LED display panel which can reduce the production cost and can greatly improve the production yield and can effectively reduce the energy consumption of the display panel and improve the service life.

In order to solve the above-mentioned technical problems, a technical solution adopted by the present disclosure is to provide an LED display panel, the LED display panel includes at least a thin film transistor array layer, a quantum dot light emitting layer and a LED array layer arranged between the thin film transistor array layer and the quantum dot light emitting layer, when the LED array layer emits excitation light, the quantum dot light emitting layer is excited to emit light of at least two colors, the LED display panel further includes a filter layer, the quantum dot light emitting layer is arranged between the LED array layer and the filter layer, the filter layer is used to filter at least a portion of the excitation light, the wavelength of the excitation light is 330-480 nm.

In order to solve the above-mentioned technical problems, another aspect of the present disclosure is to provide an LED display panel, the LED display panel includes at least a thin film transistor array layer, a quantum dot light emitting layer and a LED array layer arranged between the thin film transistor array layer and the quantum dot light emitting layer, when the LED array layer emits excitation light, the quantum dot light emitting layer is excited to emit light of at least two colors.

The advantageous effect of the present disclosure is that, unlike the case of the prior art, According to the present disclosure, the LED display panel includes at least a thin film transistor array layer, a quantum dot light emitting layer, and an LED array layer arranged between the thin film transistor array layer and the quantum dot light emitting layer, activating the quantum dot emitting layer to emit at least two colors of light when the excitation light is emitted by the LED array layer so that a monochromatic LED array can be provided when the LED array is arranged, to avoid the transfer of three different colors of LED grain caused by the complex process problems, by stimulating the quantum dot light emitting layer to send at least two colors of light to achieve full color display, greatly reducing the production cost, and can greatly improve the production of the display panel yield, and quantum dot light emitting layer of high luminous characteristics and photoluminescence stability, can effectively reduce the display panel energy consumption and improve service life.

DETAILED DESCRIPTION OF PREFERRED EMBODIMENTS

The present disclosure will now be described in detail with reference to the accompanying drawings and examples.

Figure 1:
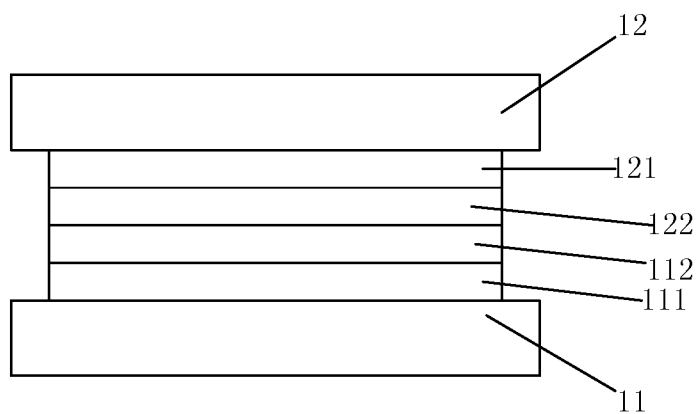
FIG. 1 is a schematic structural view of an LED display panel according to an embodiment of the present disclosure.

Please refer to FIG. 1, FIG. 1 is a schematic structural view of an LED display panel according to an embodiment of the present disclosure. In the present embodiment, the LED display panel includes at least a thin film transistor array layer 111, a quantum dot light emitting layer 122 and a LED array layer 112 arranged between the thin film transistor array layer 111 and the quantum dot light emitting layer 122, when the LED array layer 112 emits excitation light, the quantum dot light emitting layer 122 is excited to emit light of at least two colors.

The display panel further includes a driving circuit (not shown), and the thin film transistor array layer 111 is connected to the driving circuit, the thin film transistor array layer 111 and the driving circuit cooperate to control the LED array layer 111 to emit light to achieve a different display effect.

The LED display panel 10 may further include a filter layer 121, the quantum dot light emitting layer 122 is arranged between the LED array layer 112 and the filter layer 121, and the filter layer 121 is used to filter at least a part of the excitation light.

For example, the wavelength of the excitation light may be 330-480 nm. The excitation light can be blue or ultraviolet. The excitation light excitation quantum dot light emitting layer 122 emits light of at least two colors, the quantum dot light emitting layer 122 emits a color mixture of at least two colors to achieve a full color display, or the quantum dot light emitting layer 122 emits at least two colors of light and an excitation light to achieve a full color display.

For example, in one case, the quantum dot light emitting layer 122 may include red quantum dot and green quantum dot, the red quantum dot, the green quantum dot and the transparent material in the quantum dot light emitting layer are periodically arranged, in this case the excitation light must be blue. The blue light excites the red quantum dot to emit red light, the blue light excites the green quantum dot to emit green light, the excited red and green light and the blue light of the transparent area through the color mixing to achieve full color display.

In another case, the quantum dot light emitting layer 122 may include a red quantum dot, a green quantum dot and a blue quantum dot. The red quantum dot, the green quantum dot, and the blue quantum dot are periodically arranged. The excitation light can be blue or ultraviolet. The excitation light excites the red quantum dot to emit red light, excites the green quantum dot to emit green light, excites the blue quantum dot to emit blue light, the excited three kinds of light through the color mixing to achieve full color display. The filter layer 121 is used to filter the excitation light, the blue light or the ultraviolet light passing through the red quantum dot, the green quantum dot and the blue quantum dot. Please refer to the description below.

The LED display panel 10 may be provided in such a manner that the LED display panel 10 includes a first substrate 11 and a second substrate 12 arranged opposite to each other, and the thin film transistor array layer 111 is arranged on the surface of the first substrate 11 close to the second substrate 12, The LED array layer 112 is arranged on the thin film transistor array layer 111, and the filter layer 121 is arranged on the surface of the second substrate 12 close to the first substrate 11, wherein the quantum dot light emitting layer 122 is arranged on the filter layer 121 or the LED array layer 112.

In one case, the quantum dot light emitting layer 122 is formed on the filter layer 121 by a printing process. the quantum dot light emitting layer 122 is formed by printing the quantum dots (where the quantum dots may be the aforementioned red quantum dots, blue quantum dots, or green dots) on the filter layer 121 one by one. The printing method can be laser printing, spray printing and so on.

In another case, the quantum dot light emitting layer 122 includes a substrate and a quantum dot formed on the substrate by a printing process, and the substrate is covered on the LED array layer 112 by a coating or a surface sealing process.

In yet another case, the quantum dot light emitting layer 122 is formed on the filter layer 121 by a bonding process.

Figure 2:
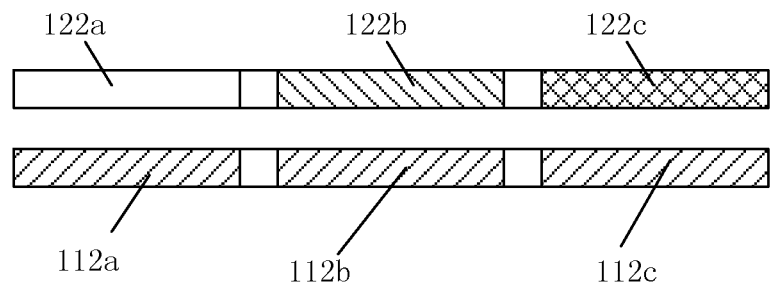
FIG. 2 is a schematic structural view of an LED array layer and a quantum dot light emitting layer according to one embodiment of the present disclosure.

Referring to FIG. 2, FIG. 2 is a schematic structural view of an LED array layer and a quantum dot light emitting layer according to an embodiment of the present disclosure. In one embodiment, the LED array layer 112 includes a plurality of LED grains 112a, 112b, 112c, and for convenience of illustration, only three cells are shown in FIG. 2, three LED grains 112a, 112b, 112c, and corresponding three quantum dot regions 122a, 122b, 122c, the quantum dot regions 122a, 122b, 122care formed by periodically arranging for the entire quantum dot emitting layer 122. All the LED grains 112a, 112b, and 112c of the LED array layer 122 are blue LED grains 112a, 112b, 112c, and the excitation light is blue, and the quantum dot light emitting layer 122 includes a transparent material 122a, a red quantum dot 122b, and a green quantum dot 122c, the blue LED grains 112b, 112c are used to emit blue light to excite the quantum dot light emitting layer 122 to emit red and green colors and to mix with blue light to achieve a different display color. Specifically, the blue LED crystal grains 112b are used to excite the red quantum dot 122b to emit red light, the blue LED grain 112c used to excite the green quantum dot 122b to emit green light, the red light emitted from the red quantum dot 122b, and the green light emitted by the green quantum dot 122b is matched with the blue light of the blue material LED 112a through the transparent material 122a to achieve full color display. The filter layer 121 is used to filter out blue light passing through the red quantum dot 122b and the green quantum dot 122b and the blue light passing through the transparent material 122a is not filtered.

Figure 3:
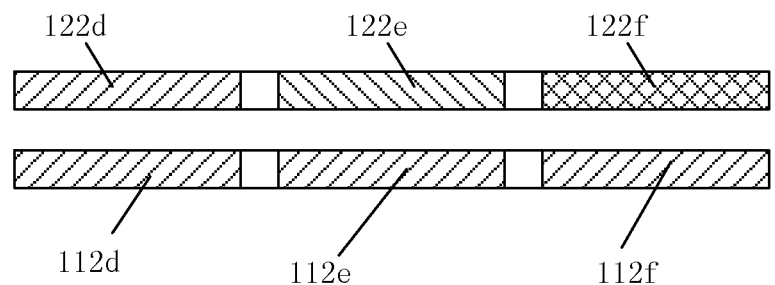
FIG. 3 is a schematic structural view of an LED array layer and a quantum dot light emitting layer according to another embodiment of the present disclosure.

Referring to FIG. 3, FIG. 3 is a schematic structural view of an LED array layer and a quantum dot light emitting layer according to another embodiment of the present disclosure. In another embodiment, the LED array layer 112 includes a plurality of LED grains 112d, 112e, 112f, and for convenience of illustration, in FIG. 3, only three cells are shown, three LED grains 112d, 112e, 111f and corresponding three quantum dot regions 122d, 122e, 122f, the quantum dot regions 122d, 122e, 122f are formed by periodically arranging for the entire quantum dot light emitting layer 122. All the LED grains of the LED array layer 112 are ultraviolet LED crystal grains, the excitation light is ultraviolet light, the quantum dot light emitting layer 122 includes a red quantum dot 122d, a green quantum dot 122e, and a blue quantum dot 122f, the ultraviolet LED grains 112d, 112e, and 112f are used to emit the ultraviolet light to emit the quantum dot light emitting layer 122 to emit red, green and blue colors for color mixing to achieve different display colors. Specifically, the ultraviolet LED crystal grains 112d are used to emit ultraviolet light to emit red light at the red quantum dot 122d, the ultraviolet LED grain 112e is used to emit ultraviolet light to excite the green quantum dot 122e to emit green light, the ultraviolet LED grain 112f is used to emit ultraviolet light to excite the blue quantum dot 122f to emit blue light, red, green and blue colors of light to achieve a different color display. The filter layer 121 is used to filter the ultraviolet light passing through the red quantum dot 122d, the green quantum dot 122e, and the blue quantum dot 122f.

Figure 4:
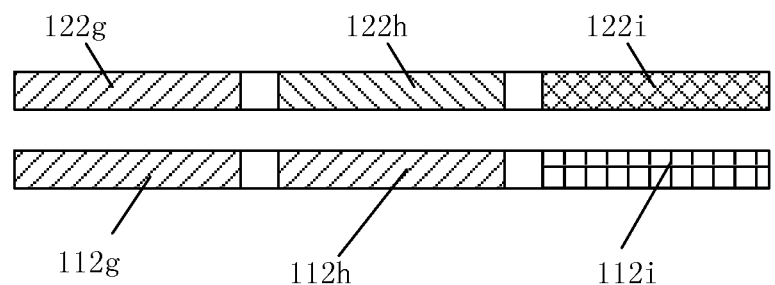
FIG. 4 is a schematic structural view of an LED array layer and a quantum dot light-emitting layer according to still another embodiment of the present disclosure.

Referring to FIG. 4, FIG. 4 is a schematic structural view of an LED array layer and a quantum dot light emitting layer according to still another embodiment of the present disclosure. In yet another embodiment, the LED array layer 112 includes a plurality of LED grains 112g, 112h, 112i, for convenience, in FIG. 3, only three units are shown, three LED grains 112g, 112h, 111i and corresponding three quantum dot regions 122g, 122h, 122i, the quantum dot regions 122g, 122h, 122i are formed by periodically arranging for the entire quantum dot light emitting layer 122. The plurality of LED grains include blue LED crystal grains 112g, 112h and ultraviolet LED crystal grains 112i, in the LED array layer 112, except that the blue LED grains 112g, 112h, the other LED grains are ultraviolet LED grains 112i. The excitation light is ultraviolet and blue, and the quantum dot light emitting layer includes a red quantum dot 122g, a green quantum dot 122h, and a blue quantum dot 122i, the ultraviolet LED crystal grains 112i and the blue LED crystal grains 112g and 112h are used to emit ultraviolet light and the blue light excitation quantum dot light emitting layer 122 to emit red, green and blue colors for coloring to achieve different display colors. Specifically, the blue LED grain 112g is used to emit blue light to emit red quantum dot 122g to emit red light, and the blue LED grains 112h are used to emit blue light to emit green light at a green quantum dot 122h, the ultraviolet LED crystal 112i is used to excite the blue quantum dot 122i to emit blue light, and the red, green and blue is excited to achieve a different display color. The filter layer 121 is used to filter blue light and ultraviolet light emitted from the blue LED grains 112g, 112h through the quantum dot without being absorbed by the quantum dots and filter ultraviolet light emitted from the LED grains 112i through the quantum dot without being absorbed by the quantum dots.

The material used for the ultraviolet LED grain may be $In_{1-x}Ga_xN(0<x\leq1)$ quantum well luminescent material, emitting an optical wavelength range of 330 nm to 400 nm.

The material used for the blue LED grain can be $In_{1-x}Ga_xN$ $(0<x\leq1)$ quantum well luminescent material, the wavelength range is 400nm~480nm.

The material of the blue quantum dots may be CdSe (cadmium selenide) or perovskite, and the half width may be 30 to 40 nm.

The green quantum dot material and the red quantum dot material are CdSe (cadmium selenide) or perovskite or InP (indium phosphide), half width of 30~50 nm.

In other embodiments, the above-mentioned grains and quantum dots may also employ other substances, and the embodiments of the present disclosure are not limited thereto.

According to the present disclosure, the LED display panel includes at least a thin film transistor array layer, a quantum dot light emitting layer, and an LED array layer arranged between the thin film transistor array layer and the quantum dot light emitting layer, activating the quantum dot emitting layer to emit at least two colors of light when the excitation light is emitted by the LED array layer so that a monochromatic LED array can be provided when the LED array is arranged, to avoid the transfer of three different colors of LED grain caused by the complex process problems, by stimulating the quantum dot light layer to achieve full color display, greatly reducing the cost of production, and can greatly improve the display panel production yield, the quantum dot light emitting layer of high luminous characteristics and photoluminescence stability, can effectively reduce the display panel energy consumption and improve service life.

The foregoing is merely an embodiment of the present disclosure and is not intended to limit the scope of the disclosure, any equivalent or equivalent process transformation made using the present specification and the accompanying drawings, either directly or indirectly, in other related technical fields, is likewise included within the scope of the patent protection of the present disclosure.

What is claimed is:

1. A LED display panel comprising at least a thin film transistor array layer, a quantum dot light emitting layer, a driving circuit couple to thin film transistor array layer, and a LED array layer arranged between the thin film transistor array layer and the quantum dot light emitting layer; wherein the thin film transistor array layer and the driving circuit cooperate to control the LED array layer to emit the excitation light into the quantum dot light emitting layer, so that the quantum dot light emitting layer is excited to emit light comprising at least two colors;

when the light comprises two colors, the light comprising two colors is mixed with the excitation light emitted through the quantum dot light emitting layer, to display full display colors by the control;

when the light comprises three colors, the light comprising three colors is mixed to display full display colors by the control.

2. The LED display panel according to claim 1, wherein, the LED array layer comprises a plurality of LED grains, the plurality of LED grains comprise blue LED grains and ultraviolet LED grains, the excitation light is ultraviolet light and blue light, the quantum dot light emitting layer comprises a red quantum dot, a green quantum dot and a blue quantum dot, the ultraviolet LED grains and the blue LED grains are configured to emit the ultraviolet excitation light and the blue excitation light into the quantum dot light emitting layer, to excite the quantum dot light emitting layer to emit red light, green light, and blue light, and the red light, the green light and, the blue light are mixed to display full display colors.

3. The LED display panel according to claim 1, wherein, the LED array layer comprises a plurality of LED grains, all the LED grains of the LED array layer are ultraviolet LED grains, the excitation light is ultraviolet, the quantum dot light emitting layer comprises a red quantum dot, a green quantum dot and a blue quantum dot, the ultraviolet LED grains are configured to emit the ultraviolet excitation light into the quantum dot light emitting layer, to excite the quantum dot light emitting layer to emit red light, green light, and blue light, and the red light, the green light and, the blue light are mixed to display full display colors.

4. The LED display panel according to claim 1, wherein, the LED array layer comprises a plurality of LED grains, all the LED grains of the LED array layer are blue LED grains, the excitation light is blue, the quantum dot light emitting layer comprises a red quantum dot, a green quantum dot, and a transparent material, the blue LED grains are configured to the emit blue excitation light into the quantum dot light emitting layer, to excite the quantum dot light emitting layer to emit red light and green light, and the red light and the green light are mixed with the blue excitation light emitted through the transparent material, to display full display colors.

5. The LED display panel according to claim 1, wherein, a wavelength of the excitation light is 330-480 nm.

6. The LED display panel according to claim 1, wherein, the LED display panel further comprises a filter layer, the quantum dot light emitting layer is arranged between the LED array layer and the filter layer, the filter layer is used to filter at least a portion of the excitation light.

7. The LED display panel according to claim 6, wherein, the LED display panel comprises a first substrate and a second substrate arranged opposite to each other, the thin film transistor array layer is arranged on a surface of the first substrate close to the second substrate, the filter layer is arranged on a surface of the second substrate close to the first substrate, wherein the quantum dot light emitting layer is arranged on the filter layer or the LED array layer.

8. The LED display panel according to claim 7, wherein, the quantum dot light emitting layer comprises a substrate and a quantum dot formed on the substrate by a printing process, and the substrate is covered on the LED array layer by a coating or a surface sealing process.

9. The LED display panel according to claim 7, wherein, the quantum dot light emitting layer is formed on the filter layer by a bonding process.

10. The LED display panel according to claim 7, wherein, the quantum dot light emitting layer is formed on the filter layer by a printing process.

11. A LED display panel comprising at least a thin film transistor array layer, a quantum dot light emitting layer, a driving circuit couple to thin film transistor array layer, a filter layer, and a LED array layer arranged between the thin film transistor array layer and the quantum dot light emitting layer; wherein the thin film transistor array layer and the driving circuit cooperate to control the LED array layer to emit the excitation light into the quantum dot light emitting layer, so that the quantum dot light emitting layer is excited to emit light comprising at least two colors; the quantum dot light emitting layer is arranged between the LED array layer and the filter layer, the filter layer is configured to filter at least a portion of the excitation light; and a wavelength of the excitation light is 330-480 nm;

when the light comprises two colors, the light comprising two colors is mixed with the excitation light emitted through the quantum dot light emitting layer, to display full display colors by the control;

when the light comprises three colors, the light comprising three colors is mixed to display full display colors by the control.

12. The LED display panel according to claim 11, wherein, the LED array layer comprises a plurality of LED grains, the plurality of LED grains comprise blue LED grains and ultraviolet LED grains, the excitation light is ultraviolet light and blue light, the quantum dot light emitting layer comprises a red quantum dot, a green quantum dot and a blue quantum dot, the ultraviolet LED grains and the blue LED grains are configured to emit the ultraviolet excitation light and the blue excitation light into the quantum dot light emitting layer, to excite the quantum dot light emitting layer to emit red light, green light, and blue light, and the red light, the green light and, the blue light are mixed to display full display colors.

13. The LED display panel according to claim 11, wherein, the LED array layer comprises a plurality of LED grains, all the LED grains of the LED array layer are blue LED grains, the excitation light is blue, the quantum dot light emitting layer comprises a red quantum dot, a green quantum dot, and a transparent material, the blue LED grains are configured to the emit blue excitation light into the quantum dot light emitting layer, to excite the quantum dot light emitting layer to emit red light and green light, and the red light and the green light are mixed with the blue excitation light emitted through the transparent material, to display full display colors.

14. The LED display panel according to claim 11, wherein, the LED array layer comprises a plurality of LED grains, all the LED grains of the LED array layer are ultraviolet LED grains, the excitation light is ultraviolet, the quantum dot light emitting layer comprises a red quantum dot, a green quantum dot and a blue quantum dot, the ultraviolet LED grains are configured to emit the ultraviolet excitation light into the quantum dot light emitting layer, to excite the quantum dot light emitting layer to emit red light, green light, and blue light, and the red light, the green light and, the blue light are mixed to display full display colors.

15. The LED display panel according to claim 11, wherein, the LED display panel comprises a first substrate and a second substrate arranged opposite to each other, the thin film transistor array layer is arranged on a surface of the first substrate close to the second substrate, the LED array layer is arranged on the thin film transistor array layer, the filter layer is arranged on a surface of the second substrate close to the first substrate, wherein the quantum dot light emitting layer is arranged on the filter layer or the LED array layer.

16. The LED display panel according to claim 15, wherein, the quantum dot light emitting layer comprises a substrate and a quantum dot formed on the substrate by a printing process, and the substrate is covered on the LED array layer by a coating or a surface sealing process.

17. The LED display panel according to claim 15, wherein, the quantum dot light emitting layer is formed on the filter layer by a printing process.

18. The LED display panel according to claim 15, wherein, the quantum dot light emitting layer is formed on the filter layer by a bonding process.

* * * * *